US007769357B2

(12) United States Patent
Lai et al.

(10) Patent No.: US 7,769,357 B2
(45) Date of Patent: Aug. 3, 2010

(54) MULTI-CHANNEL RECEIVER WITH IMPROVED AGC

(75) Inventors: Yhean-Sen Lai, Warren, NJ (US); Jie Song, Lower Macungie Township, Lehigh County, PA (US); Zhenyu Wang, Bethlehem, PA (US); Jinguo Yu, Flemington, NJ (US)

(73) Assignee: Agere Systems Inc., Allentown, PA (US)

( * ) Notice: Subject to any disclaimer, the term of this patent is extended or adjusted under 35 U.S.C. 154(b) by 630 days.

(21) Appl. No.: 11/789,550

(22) Filed: Apr. 25, 2007

(65) Prior Publication Data

US 2008/0268798 A1     Oct. 30, 2008

(51) Int. Cl.
*H04B 7/00*      (2006.01)
*H04M 1/00*      (2006.01)

(52) U.S. Cl. ............... 455/234.1; 455/245.1; 455/245.2; 455/132; 455/553.1

(58) Field of Classification Search ................. 455/132, 455/136, 138, 234.1, 240.1, 245.1, 246.1
See application file for complete search history.

(56) References Cited

U.S. PATENT DOCUMENTS

| | | | | |
|---|---|---|---|---|
| 4,066,992 A | 1/1978 | Buller et al. | ................... | 367/36 |
| 5,345,439 A | 9/1994 | Marston | ...................... | 370/18 |
| 5,557,337 A | 9/1996 | Scarpa | ........................ | 348/558 |
| 5,563,916 A * | 10/1996 | Scarpa | ........................ | 375/345 |
| 5,721,757 A * | 2/1998 | Banh et al. | ................... | 375/345 |
| 5,732,342 A * | 3/1998 | Roth et al. | ................ | 455/234.1 |
| 5,825,807 A | 10/1998 | Kumar | ........................ | 375/200 |
| 5,838,728 A | 11/1998 | Alamouti et al. | ............ | 375/265 |
| 5,946,292 A | 8/1999 | Tsujishita et al. | ........... | 370/204 |
| 5,950,112 A * | 9/1999 | Hori et al. | .................... | 725/148 |
| 6,069,530 A | 5/2000 | Clark | ......................... | 330/149 |

(Continued)

FOREIGN PATENT DOCUMENTS

JP     10271088 A     10/1998

OTHER PUBLICATIONS

U.S. Appl. No. 10/204,631, filed Aug. 16, 2005, Malkemes et al.

(Continued)

*Primary Examiner*—Duc M Nguyen
(74) *Attorney, Agent, or Firm*—Mendelsohn, Drucker & Assoc., P.C.; Craig M. Brown; Steve Mendelsohn

(57) ABSTRACT

An improved multi-channel receiver for satellite broadcast applications or the like. In an exemplary embodiment, an AGC loop, under the control of an AGC processor, controls the gain of an analog sub-receiver adapted to simultaneously receive multiple signals to achieve a desired AGC setpoint signal intensity from the sub-receiver. Multiple digital demodulators, coupled to the sub-receiver by an analog-to-digital converter (ADC), demodulate the multiple received signals. The AGC controller, based upon which of the received signals are being demodulated, selects the desired AGC setpoint from a table of setpoints. The AGC controller may also provide selective power control to circuitry in the receiver and select the resolution of the ADC. The controller updates the AGC loop with step values selected from a group of values by an AGC control algorithm. Different groups of step values may be used by the controller depending on whether the signals are fading or not.

27 Claims, 4 Drawing Sheets

U.S. PATENT DOCUMENTS

| | | | | |
|---|---|---|---|---|
| 6,094,162 | A | 7/2000 | Sullivan | 342/357.01 |
| 6,122,331 | A * | 9/2000 | Dumas | 375/345 |
| 6,144,513 | A | 11/2000 | Reed et al. | 360/51 |
| 6,310,513 | B1 | 10/2001 | Iemura | 329/304 |
| 6,317,456 | B1 | 11/2001 | Sayeed | 375/227 |
| 6,317,470 | B1 | 11/2001 | Kroeger et al. | 375/340 |
| 6,353,463 | B1 * | 3/2002 | Seo | 348/731 |
| 6,377,316 | B1 | 4/2002 | Mycynek et al. | 348/731 |
| 6,389,000 | B1 | 5/2002 | Jou | 370/342 |
| 6,473,467 | B1 | 10/2002 | Wallace et al. | 375/267 |
| 6,542,203 | B1 * | 4/2003 | Shadwell et al. | 348/726 |
| 6,586,996 | B2 | 7/2003 | Fanous et al. | 330/254 |
| 6,598,200 | B1 | 7/2003 | Greenwood et al. | 714/774 |
| 6,618,367 | B1 | 9/2003 | Riazi et al. | 370/347 |
| 6,628,724 | B2 | 9/2003 | Bannasch et al. | 375/259 |
| 6,643,498 | B1 * | 11/2003 | Miyajima | 455/230 |
| 6,657,491 | B2 | 12/2003 | Fanous et al. | 330/124 R |
| 6,670,848 | B2 | 12/2003 | Fanous et al. | 330/124 R |
| 6,757,334 | B1 | 6/2004 | Feher | 375/259 |
| 6,771,719 | B1 | 8/2004 | Koyama et al. | 375/345 |
| 6,798,791 | B1 | 9/2004 | Riazi et al. | 370/515 |
| 6,801,085 | B2 | 10/2004 | Fanous et al. | 330/124 R |
| 6,838,937 | B2 | 1/2005 | Fanous et al. | 330/124 R |
| 6,885,852 | B2 | 4/2005 | Hughes et al. | 455/234.1 |
| 6,992,855 | B2 | 1/2006 | Ehrlich | 360/77.08 |
| 7,002,638 | B2 * | 2/2006 | Yeo et al. | 348/729 |
| 7,020,218 | B2 | 3/2006 | Arnesen | 375/316 |
| 7,050,419 | B2 | 5/2006 | Azenkot et al. | 370/347 |
| 7,058,002 | B1 | 6/2006 | Kumagai et al. | 370/203 |
| 7,062,243 | B2 * | 6/2006 | Simmons et al. | 455/234.1 |
| 7,065,165 | B2 | 6/2006 | Heinonen et al. | 375/345 |
| 7,079,584 | B2 | 7/2006 | Feher | 375/260 |
| 7,099,688 | B2 | 8/2006 | Wilson | 455/552.1 |
| 7,106,232 | B2 | 9/2006 | Harberts et al. | 341/139 |
| 7,110,434 | B2 | 9/2006 | Currivan et al. | 375/144 |
| 7,110,735 | B2 | 9/2006 | Abe | 455/234.1 |
| 7,123,892 | B2 | 10/2006 | Li et al. | 455/142 |
| 7,136,622 | B2 | 11/2006 | Rofougaran et al. | 455/20 |
| 7,142,665 | B2 | 11/2006 | Barron et al. | 379/406.08 |
| 7,149,263 | B2 | 12/2006 | Higure | 375/345 |
| 7,174,165 | B2 | 2/2007 | Lee | 455/422.1 |
| 7,190,683 | B2 | 3/2007 | Giallorenzi et al. | 370/335 |
| 7,359,690 | B2 | 4/2008 | Lai | 455/240.1 |
| 7,373,126 | B2 * | 5/2008 | Narita | 455/234.1 |
| 7,386,285 | B2 | 6/2008 | Yamauchi | 455/136 |
| 7,415,259 | B2 | 8/2008 | Fishman et al. | 455/250.1 |
| 7,428,022 | B2 | 9/2008 | Teichner et al. | 348/725 |
| 7,460,832 | B2 | 12/2008 | Lee et al. | 455/63.1 |
| 7,496,163 | B2 | 2/2009 | Terao | 375/345 |
| 7,515,891 | B2 * | 4/2009 | Darabi | 455/250.1 |
| 7,539,469 | B2 * | 5/2009 | Zahm et al. | 455/130 |
| 7,551,736 | B2 | 6/2009 | Lee et al. | 380/42 |
| 7,579,912 | B2 | 8/2009 | Fanous et al. | 330/254 |
| 7,583,746 | B2 * | 9/2009 | Aoki et al. | 375/267 |
| 7,586,999 | B2 * | 9/2009 | Lee | 375/316 |
| 2002/0057750 | A1 | 5/2002 | Nakao et al. | 375/345 |
| 2002/0163879 | A1 | 11/2002 | Li et al. | 370/200 |
| 2003/0032402 | A1 | 2/2003 | Asano | 455/234.1 |
| 2003/0035070 | A1 | 2/2003 | Fanous et al. | 348/707 |
| 2004/0161026 | A1 | 8/2004 | Jensen et al. | 375/224 |
| 2004/0214529 | A1 | 10/2004 | Terao | 455/78 |
| 2004/0218576 | A1 | 11/2004 | Imagawa et al. | 370/342 |
| 2005/0096004 | A1 | 5/2005 | Tso et al. | 455/334 |
| 2005/0128362 | A1 | 6/2005 | Teichner et al. | 348/725 |
| 2005/0231783 | A1 | 10/2005 | Panzeri | 359/237 |
| 2006/0034400 | A1 | 2/2006 | Yang et al. | 375/345 |
| 2006/0050817 | A1 | 3/2006 | Kanemoto et al. | 375/347 |
| 2006/0077080 | A1 | 4/2006 | Yamauchi | 341/114 |
| 2006/0264191 | A1 * | 11/2006 | Lai | 455/127.2 |
| 2007/0033624 | A1 | 2/2007 | Oh | 725/100 |
| 2007/0041481 | A1 | 2/2007 | Malkemes et al. | 375/345 |
| 2007/0054642 | A1 * | 3/2007 | Bhardwaj et al. | 455/234.1 |
| 2007/0076783 | A1 | 4/2007 | Dishman et al. | 375/136 |
| 2007/0089148 | A1 | 4/2007 | Oh et al. | 725/90 |
| 2008/0070534 | A1 | 3/2008 | Lai | 455/232.1 |
| 2008/0139110 | A1 | 6/2008 | Lai et al. | 455/3.02 |
| 2008/0159446 | A1 | 7/2008 | Lai et al. | 375/345 |
| 2008/0212656 | A1 | 9/2008 | Feher | 375/150 |
| 2008/0267326 | A1 * | 10/2008 | Lai et al. | 375/345 |
| 2008/0268798 | A1 | 10/2008 | Lai et al. | 455/127.2 |
| 2008/0311845 | A1 | 12/2008 | Scarpa et al. | 455/3.02 |
| 2009/0068968 | A1 * | 3/2009 | Rofougaran | 455/136 |
| 2009/0110047 | A1 | 4/2009 | Lai et al. | 375/232 |
| 2009/0168809 | A1 | 7/2009 | Scarpa et al. | 370/503 |
| 2009/0170424 | A1 | 7/2009 | Malkemes et al. | 455/3.02 |

OTHER PUBLICATIONS

U.S. Appl. No. 10/765,041, filed Jun. 24, 2004, Fishman et al.
U.S. Appl. No. 11/133,538, filed May 20, 2005, Lai.
U.S. Appl. No. 11/522,689, filed Sep. 18, 2006, Lai.
U.S. Appl. No. 11/608,449, filed Dec. 8, 2006, Lai.
U.S. Appl. No. 11/648,702, filed Dec. 29, 2006, Lai et al.
U.S. Appl. No. 11/133,538, filed May 20, 2005, Y. Lai.

* cited by examiner

Figure 2

TABLE 1

| SIGNAL BEING DEMODULATED ("TRACKING") | | | AGC | ADC 113 | POWER CONTROL SIGNALS | | |
|---|---|---|---|---|---|---|---|
| COFDM | TDM1 | TDM2 | SETPOINT | RESOL. (BITS) | 127 | 137 | 147 |
| (NO RECEIVED SIGNAL) | | | 40dB | 12 | OFF | OFF | OFF |
| YES | NO | NO | 35dB | 12 | ON | OFF | OFF |
| NO | YES | NO | 24dB | 10 | OFF | ON | OFF |
| NO | NO | YES | 24dB | 10 | OFF | OFF | ON |
| NO | YES | YES | 30dB | 12 | OFF | ON | ON |
| YES | YES | NO | 38dB | 12 | ON | ON | OFF |
| YES | NO | YES | 38dB | 12 | ON | OFF | ON |
| YES | YES | YES | 40dB | 12 | ON | ON | ON |

TABLE 2

| AGC CONTROL VALUE | STEP SIZE |
|---|---|
| RECEIVED SIGNAL STATE | 2,3,4,5 or 10dB |
| "FADING" "ON" OR "OFF" (NON-FADING) | 0.5, 1,2,3,4, or 5 dB |

MULTI-CHANNEL RECEIVER WITH IMPROVED AGC

CROSS-REFERENCE TO RELATED APPLICATIONS

The subject matter of this application is related to U.S. patent application Ser. No. 11/796,006, which was filed on the same date as this application and the teachings of which are incorporated herein by reference.

TECHNICAL FIELD

The present invention relates to digital data receivers, and, in particular, to multi-channel data receivers for use in satellite broadcast systems or the like.

BACKGROUND

A typical satellite digital audio radio service (SDARS) system, such as that provided by XM Satellite Radio Inc. of Washington, D.C. or Sirius Satellite Radio Inc. of New York City, N.Y., uses two or more satellites with orbits that provide a usable signal over most of North America at all times. However, the signals from the satellites tend not to be received well in cities or anywhere a satellite receiver does not have an unobstructed view of at least one of the satellites. Thus, in cities and other areas where direct reception from a satellite is impossible or unlikely, the SDARS provider may have installed terrestrial repeaters that provide a digital audio data signal carrying the same digital audio data that the satellites are broadcasting. The use of redundant digital audio data channels minimizes service outages as the satellites orbit the earth or as a user moves about. To minimize interference and provide redundancy, the terrestrial repeater and each satellite transmits its digital audio data signal on a different channel, each channel having a different carrier frequency. Moreover, the modulation method used for the terrestrial channel (e.g., a carrier-orthogonal frequency division multiplexed (COFDM) modulation technique) is chosen for its resistance to fading caused by multipath interference and is more complicated than the modulation method used for the satellite channels (e.g., a time division multiplexed (TDM) modulation technique).

A typical prior art SDARS receiver has multiple independent analog sub-receivers therein, one sub-receiver for each channel, and circuitry within the receiver selects which sub-receiver provides the best data signal for decoding. The radio frequency (RF) and intermediate frequency (IF) portions of the sub-receivers are analog, and each sub-receiver contains an analog-to-digital converter (ADC) that digitizes IF signals for further processing by various digital circuits. Because each analog sub-receiver consumes considerable power, an SDARS receiver having three or more sub-receivers operating simultaneously does not lend itself to portable or other low-power applications. In addition, having three or more separate sub-receivers makes the SDARS receiver physically larger than desired for certain applications.

SUMMARY

In one embodiment, the present invention includes the steps comprising steps (a) through (e). Step (a) is generating, based on a gain control signal, an output signal from one or more received signals of a plurality of possible received signals. Step (b) is generating an intensity value in response to the output signal. Step (c) is, for each possible received signal, determining whether or not to demodulate the output signal using a demodulator corresponding to the possible received signal. Step (d) is generating a setpoint value in response to the determinations of step (c). Step (e) is adaptively updating the gain control signal based on changes in the intensity value. The updates in the gain control signal results in the intensity value approximating the setpoint value.

In still another embodiment, the present invention comprises the steps of (a) through (g). Step (a) is generating, based on a gain control signal, an output signal from the one or more received signals. Step (b) is generating an intensity value in response to the output signal. Step (c) is, for each possible received signal, (i) determining whether or not to demodulate the output signal using a demodulator corresponding to the possible received signal and (ii) generating a flag in accordance with the determination. Step (d) is generating a signal strength signal for each possible received signal. Step (e) is selecting a plurality of step sizes from a larger plurality of step sizes in response to the plurality of flags and the plurality of signal strength signals. Step (f) is selecting a step size from the selected plurality of step sizes. Step (g) is adaptively updating the gain control signal based on change in the intensity value and the selected step size.

BRIEF DESCRIPTION OF THE DRAWINGS

The aspects, features, and advantages of the present invention will become more fully apparent from the following detailed description, the appended claims, and the accompanying drawings in which like reference numerals identify similar or identical elements.

FIG. 2 are tables of exemplary operational data used to control the receiver of FIG. 1; and, FIGS. 3A and 3B combined is a flowchart illustrating a portion of an exemplary AGC control process implemented by the AGC controller of FIG. 1, the process using the data in the tables of FIG. 2.

DETAILED DESCRIPTION

For purposes of this description and unless explicitly stated otherwise, each numerical value and range should be interpreted as being approximate as if the word "about" or "approximately" preceded the value of the value or range. Further, reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected," refer to any manner known in the art or later developed in which energy is allowed to be transferred between two or more elements and the interposition of one or more additional elements is contemplated, although not required. Conversely, the terms "directly coupled," "directly connected," etc., imply the absence of such additional elements.

Signals and corresponding nodes, ports, inputs, or outputs may be referred to by the same name and are interchangeable for purposes here.

Figure 1:
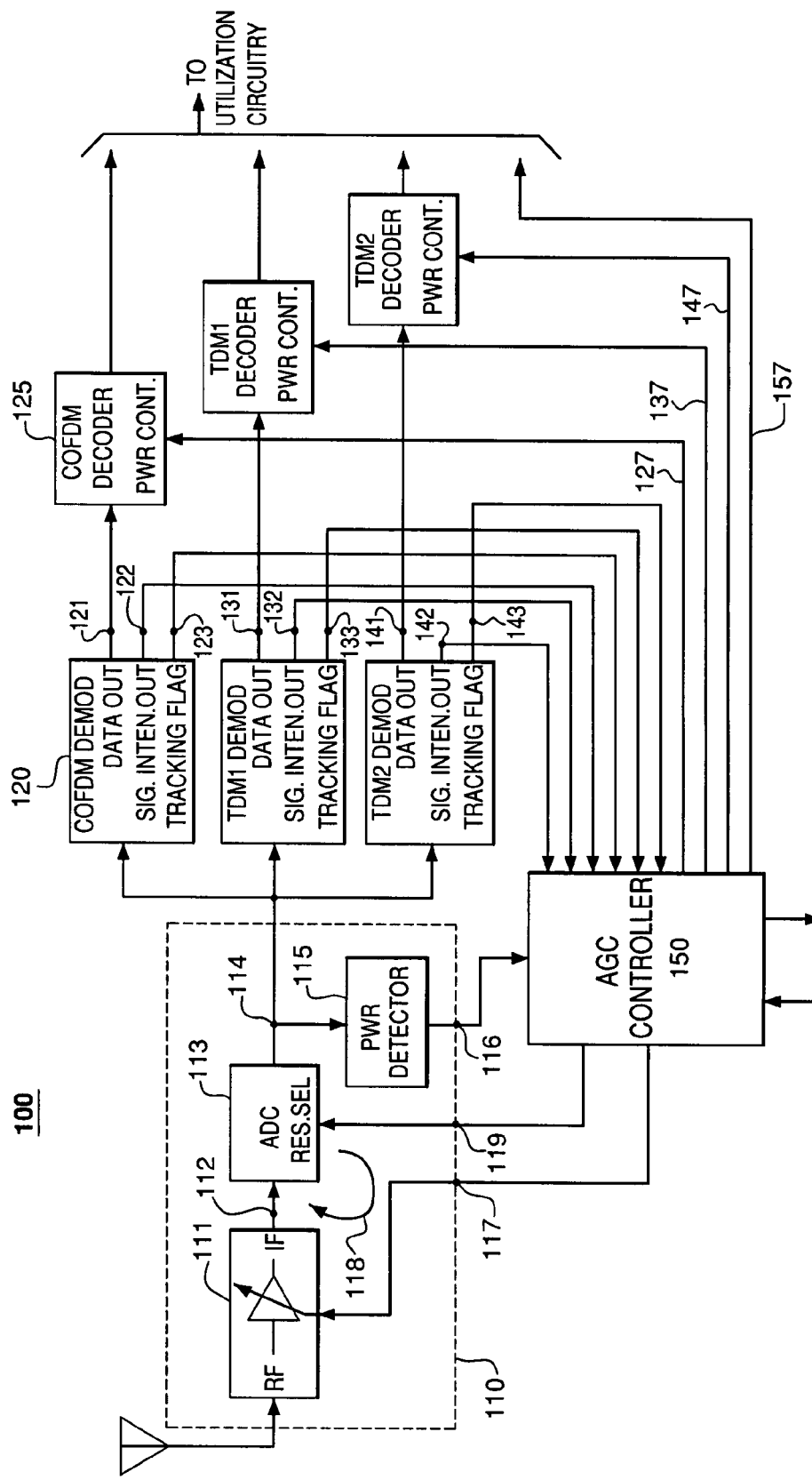
FIG. 1 is a simplified block diagram of a portion of an improved SDARS receiver with one analog sub-receiver, one AGC loop, digital signal demodulators and corresponding decoders, and an AGC controller according to the one exemplary embodiment of the present invention.

Referring to FIG. 1, an exemplary embodiment of the invention is shown, in which a simplified block diagram of an SDARS receiver 100 having one sub-receiver 110 capable of simultaneously receiving a plurality of channels (RF signals) is diagrammed. The sub-receiver 110 comprises an analog RF/IF section 111 producing an amplified analog IF output signal at node 112, the analog output signal having therein a combination of one or more IF signals based on the received signals, each IF signal with a different IF carrier frequency. The analog output signal is digitized by an analog-to-digital converter (ADC) 113 to produce a digitized output signal at node 114. Included in the sub-receiver is a power detector 115, preferably a root-mean-square (RMS) power detector, generating an intensity value at node 116. It is understood that the power detector 115 may be of another design, such as a peak detector. While shown as responsive to the digitized output signal on node 114, the detector 115 may instead receive the analog output signal on node 112 for generating the intensity value. Moreover, as is known in the art, the RF/IF section 111 may be a direct conversion sub-receiver, avoiding the need for an IF portion by amplifying and directly converting received RF signals to a base-band analog output signal at node 112. Thus, the section 111 may be referred to generically as a gain section.

The RF/IF section 111 is responsive to an AGC control signal on node 117 to vary the gain of the RF/IF section 111. As will be discussed in more detail below, the AGC control signal is produced by AGC controller 150 in response to the intensity value from detector 115, thereby forming an AGC loop 118 for the sub-receiver 110. Generally, the AGC controller 150, in response to a change in the intensity value, changes the AGC control signal to partially counteract the change in the amplitude of the digitized output signal on node 114. For example, when a change in the intensity value indicates an increase in the power (thus, the amplitude) of the digitized output signal on node 114, the AGC controller 150 changes the AGC control signal in response to reduce the gain of the RF/IF section 111 and lessen the increase in the amplitude of the digitized output signal. Conversely, when a change in the intensity value indicates a decrease in the power (thus, the amplitude) of the digitized output signal on node 114, the AGC controller 150 changes the AGC control signal in response to increase the gain of the RF/IF section 111.

In this example, coupled to the output node 114 are three demodulators 120, 130, and 140, one for each channel, each demodulating a corresponding IF signal derived from a received signal (for simplicity, hereinafter each demodulator is referred to as demodulating a received signal). For example, the demodulator 120, in this example a digital down-converter for a COFDM-modulated signal, demodulates a COFDM received signal in the digitized output signal on node 114 to produce a demodulated signal on node 121. Similarly, demodulators 130 and 140, in this example digital down-converters for TDM-modulated signals, produce demodulated signals on respective nodes 131 and 141. Decoders 120, 130, and 140 are known in the art. Details of the demodulators are described in "A Single Path Architecture and Automatic Gain Control (AGC) Algorithm for Low Power SDARS Receiver," U.S. patent application Ser. No. 11/204,631, assigned to the same assignee as this application, and incorporated herein in its entirety.

Each demodulator 120, 130, and 140 provides demodulator status data comprising two exemplary data signals: 1) a signal (received signal strength signal 122, 132, and 142) indicating the intensity or strength of the received signal being demodulated, and 2) a status flag (TRACKING flag 123, 133, and 143) indicating whether or not the demodulator is demodulating ("tracking") the received signal. Generally, the TRACKING flag, when set, indicates the presence of a received signal good enough for demodulation (e.g., having a sufficiently good signal-to-noise ratio), and the received signal strength signal, when combined with the TRACKING flag, is indicative of whether the received signal is fading or not. It is noted that, in this embodiment, having a clear (not set) TRACKING flag does not mean the received signal is not present at the demodulator. Instead, as will be described below, an AGC control algorithm implemented by the controller 150 reads the demodulator status data (TRACKING flag and received signal strength signal) from each demodulator and determines the state of each received signal, e.g., if each received signal is present and fading, present and not fading, or not present.

Coupled to each demodulator 120, 130, and 140 are corresponding data decoders 125, 135, and 145, each decoder performing additional signal processing of the demodulated data signals on the corresponding nodes output nodes 121, 131, and 141. Output signals (not numbered) from the decoders are then processed by utilization circuitry (not shown) to extract audio and other information desired by a user.

As is typically done by those skilled in the art, the gain in the RF/IF section 111 is adjusted in response to the AGC control signal 117 so that the RF/IF section 111 has the proper amount of gain to produce an analog IF output signal on node 112 with an average amplitude near the middle of the dynamic range of ADC 113. This approach of setting the average amplitude to mid-range avoids saturating the ADC 113 on peaks in the amplitude of the analog IF output signal on node 112, while leaving the analog signal with sufficient amplitude that the ADC 113 produces a digitized output signal (containing the one or more IF signals in digitized form) at node 114 having low distortion and a good signal-to-noise ratio (SNR). However, the average and peak amplitudes of the analog signal on node 112 are dependent on the received signal characteristics (e.g., the peak-to-average ratio of a particular received signal) and the number of the signals being received at any one time. For example, a COFDM signal typically has a significantly higher (approximately 12 dB) peak-to-average ratio than a TDM signal (approximately 6 dB). Should the AGC loop 118 attempt to maintain the same average power at node 112 for a TDM signal as for a COFDM signal, the ADC 113 might saturate on signal peaks of the TDM signal, thereby reducing the signal-to-noise ratio of the digitized signal on node 114. At the same time, the average power of received signals at node 112 should be maintained at a high enough level to give the digital signal on node 114 a signal-to-noise ratio that results in satisfactory performance of the receiver 100. Thus, it is desirable to adjust the gain of the gain section 111 to be dependent on the intensity value from detector 115 and the number and characteristics of the signals being received.

Because a designer of the receiver 100 knows a priori the characteristics of each possible received signal and all combinations of those signals that could be received by the receiver 100, the designer can determine the appropriate average power level (as measured by detector 115) of the AGC loop 118 to maintain on node 112 without saturating the ADC 113. These values may be stored in a table or memory for use by the AGC controller 150. In one exemplary embodiment, memory 152 stores several AGC coefficients for the controller 150 to use depending on the signal environment (e.g., the number of signals being received and whether they are fading or steady-state) the receiver 100 is operating in. Referring temporarily to Table 1 in FIG. 2, exemplary values for the desired average power level setpoint is shown for different combinations of the COFDM, TDM1, and TDM2 signals being demodulated (as indicated by the TRACKING flag being set) at any given time. Accordingly, the controller 150 adjusts (updates) the AGC control signal 117 up or down, as appropriate, depending whether the intensity value 116 is greater or smaller than the desired average power level setpoint until the setpoint is approximately reached. The controller 150 reads the TRACKING demodulator status flags 123, 133, and 143 from demodulators 120, 130, and 140, respectively, to determine which signals are being demodulated and takes from the Table 1 in FIG. 2 the desired setpoint. Preferably and in this example, Table 1 is indexed by a pointer created by concatenating the TRACKING flags 123, 133, and 143 (e.g., set=1, clear (not set)=0) together to produce a binary-weighted pointer having one of eight values. It is understood that other methods of combining the TRACKING flags to form the pointer may be used.

It is preferable that the AGC control signal 117 from the AGC controller 150 changes in discrete steps (e.g., 1 dB, 5 dB, etc.) to reduce the frequency of changes to the AGC control signal 117. Moreover, as known in the art, it is desirable that the AGC controller 150 implement a level of hysteresis in the generation of the AGC control signals to further reduce the frequency of changes thereto and enhance stability within the primary AGC loop 118.

Low latency is an important feature of a good AGC system. Therefore, the AGC control signal 117 should quickly follow changes in the intensity value 116. Further, it is desirable that the AGC loop 118 converge quickly to the desired setpoint value. To do so, the amount of each step in the AGC control signal 117 (i.e., step size) should be proportional to the difference in magnitude between the intensity value 116 and the desired setpoint, e.g., the larger the difference between the intensity value 116 and the desired setpoint value, the larger the step size. To accomplish the above, the controller 150 implements a least-mean-squared (LMS) algorithm to calculate the AGC control signal 117, although other AGC algorithms may be used instead. The LMS algorithm, as is known in the art and as used in this example, adjusts the AGC control signal 117 in steps of varying size until the intensity value is approximately that of the desired setpoint. The step sizes used by the LMS algorithm are preferably selected from a group of step sizes, such as those shown in exemplary Table 2 of FIG. 2, depending on the state of the received signals at demodulators 120, 130, and 140. As mentioned above and as will be discussed in more detail below in connection with FIGS. 3A and 3B, controller 150 reads the status data from the demodulators (TRACKING flags 123, 133, 143 and corresponding received signal strength signals 122, 132, 142) to determine the state of the received signals and to determine the AGC control signal step size and AGC setpoint by looking up the values from the exemplary tables of FIG. 2. The values shown in the tables are purely exemplary and other values may be used instead. Moreover, the number of values shown may be reduced or increased as needed.

It is understood that, if fewer than all possible signals are being simultaneously received by the receiver 100, not all circuitry therein is being used and the unused circuitry may be shut down to conserve power. For example, if a single RF signal is being received by the sub-receiver 110, then instead of all three decoders 125, 135, and 145 operating and consuming power, just the decoder for that received signal is used and the other decoders and any associated circuitry (such as any control logic) are disabled. Similarly, if two signals are being simultaneously received, then the two decoders for those signals are used and the remaining decoder and associated circuitry are disabled. In addition, it has been found that the number of bits used by ADC 113 may be reduced where higher ADC resolution does not contribute any significant improvement in the performance of the receiver 100. Reducing the resolution by the ADC 113 by turning off sub-circuits therein reduces the power consumed by the sub-receiver 110. Which circuits to turn on and off as well as the resolution of the ADC 113 is controlled by controller 150. For example, the controller 150 uses the data stored in memory 152 to control the conversion resolution by the ADC 113 via control path 119, and selectively powers or enables the decoders 125, 135, and 145 via control paths 127, 137, and 147, respectively. Additional circuitry (not shown) may be enabled or controlled by optional control path 157. Exemplary ADC 113 resolution values and decoder power control signal states are shown in Table 1 of FIG. 2. For the ADC 113, the resolution (in bits per conversion) of the ADC 113 is shown as either 10 or 12 bits depending on which signals are being demodulated. It is noted that ADC resolution values other than, or in addition to, the ones listed in Table 1 of FIG. 2 may be used.

Figure 3A:
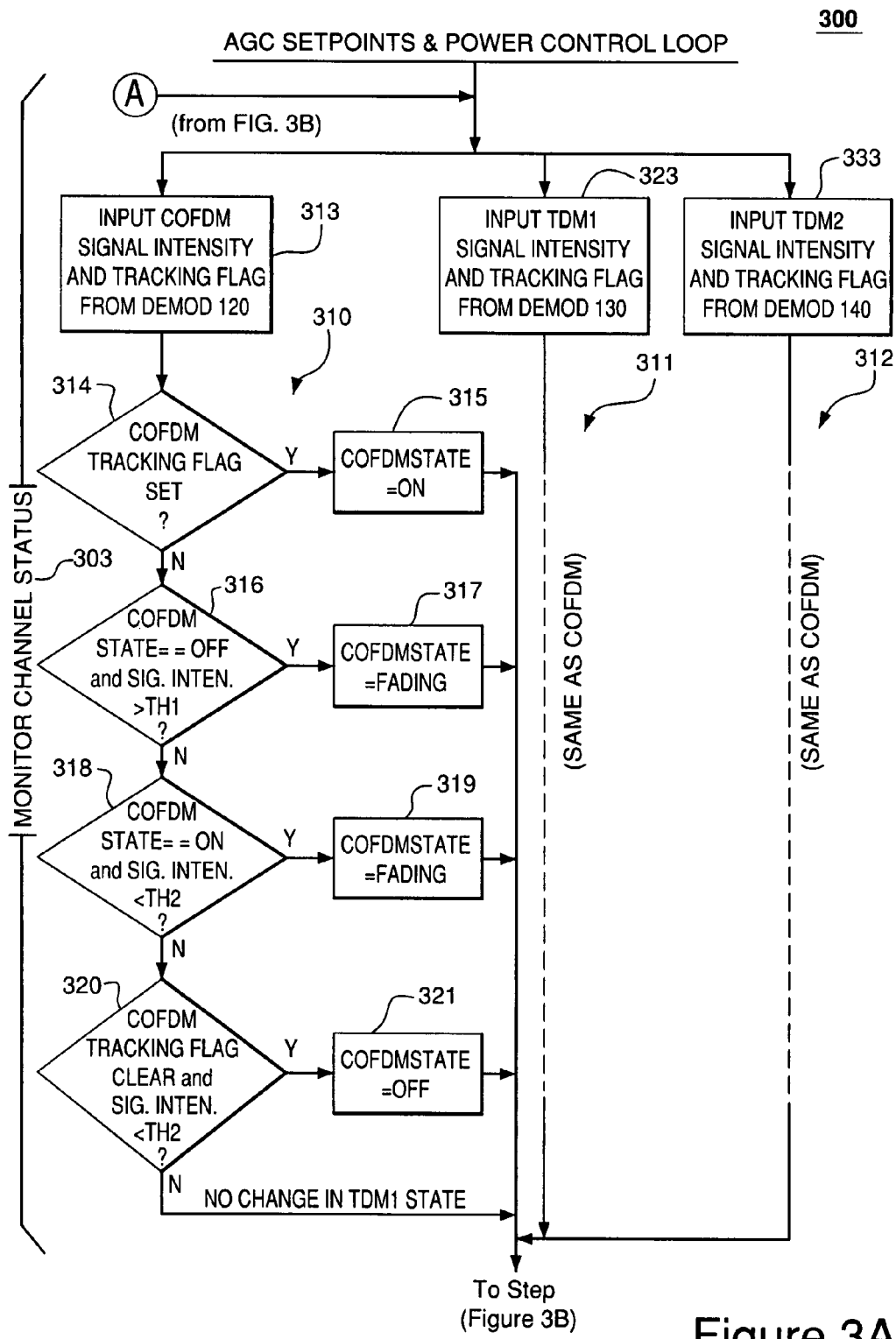
Figure 3B:
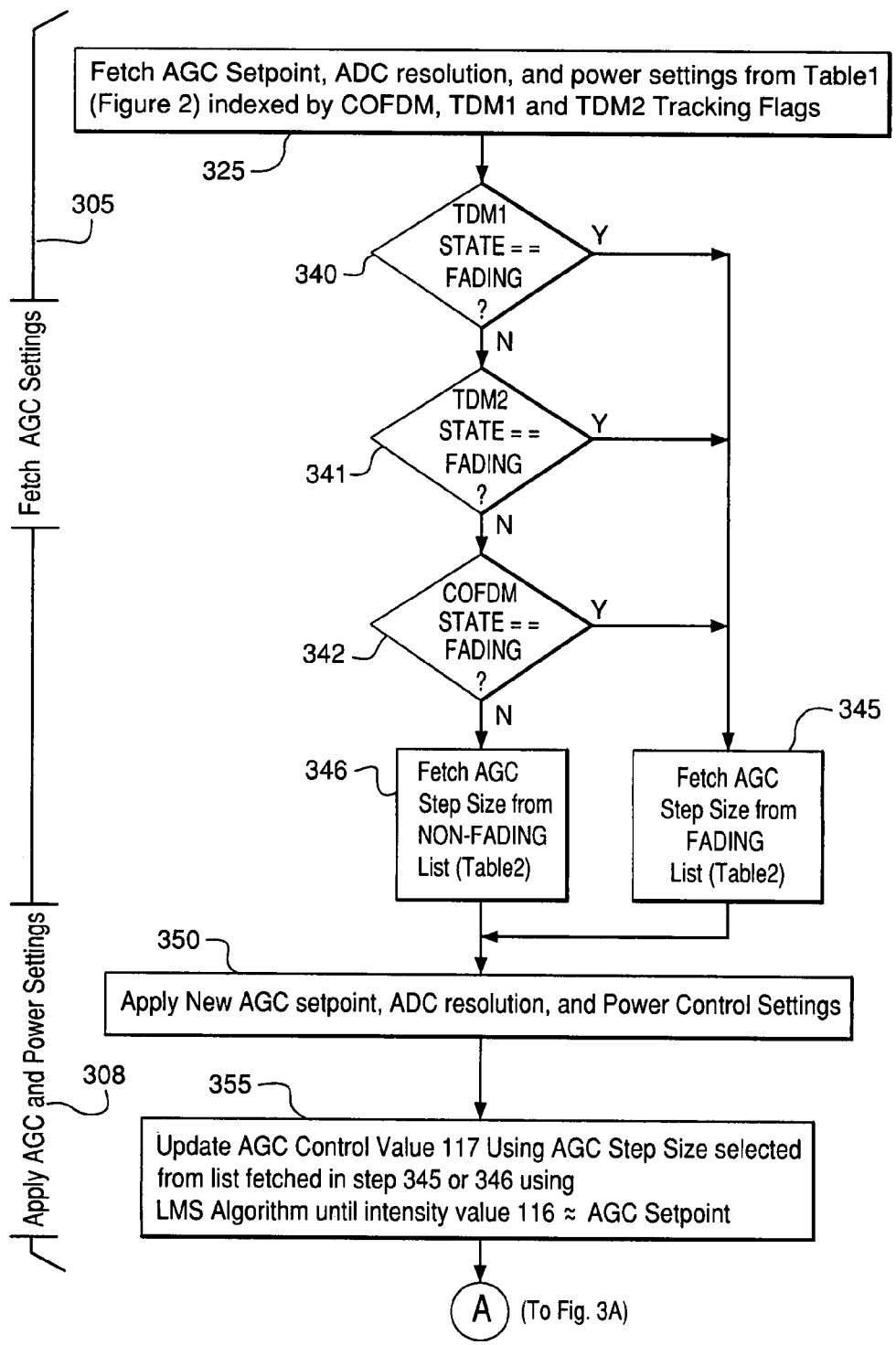

FIGS. 3A and 3B illustrate an exemplary process of how the controller 150 determines the state of the COFDM, TDM1, and TDM2 channels, and how the AGC parameters and power control settings are retrieved from the memory 152. The flowchart 300 is segmented into three basic portions: 1) a first portion 303 in FIG. 3A, where the controller 150 first determines the state of the signals being processed by the demodulators 120, 130, and 140, 2) a second portion 305 in FIG. 3B where the controller 150 fetches AGC and power settings, and 3) a third portion 308 in FIG. 3B where the controller 150 applies the AGC settings and the power settings to the receiver 100.

In portion 303 of FIG. 3A, the controller 150 reads the status data of the demodulators 120, 130, and 140, and then processes the data to determine the state of the received signals. There are three process flows 310, 311, and 312 shown in portion 303. To simplify the flowchart 300, only steps 313-321 in process flow 310 are shown to illustrate the operation of controller 150 when determining the COFDM signal state. It is understood that substantially the same steps will be followed for the TDM1 and TDM2 signals, as illustrated by the dashed lines in process flow 311 corresponding to determining the TDM1 signal state and the dashed lines in process flow 312 corresponding to determining the TDM2 signal state. Moreover, the process flows 310-312 are shown in parallel to illustrate the desired concurrency of the three process flows executed by the controller 150 in the first portion 303. It is understood, however, that the process flows may be executed serially or the steps in the various process flows may be interleaved.

Beginning with step 313 (and, similarly, with steps 323 and 333), the controller 150 retrieves the TRACKING flag and COFDM signal intensity data from demodulator 120. In step 314, if the TRACKING flag is set, then in step 315 the COFDM signal state variable is set to "ON" and control passes to step 325 (FIG. 3B). However, if the TRACKING flag is clear (i.e., not set), then in step 316 if the extant COFDM signal state variable (i.e., the signal state as determined from an immediately preceding analysis by controller 150 executing process flow 310) is set to "OFF" and the COFDM signal intensity is greater than a threshold value Th1, then in step 317 the COFDM signal state variable is set to "FADING," indicating that the COFDM signal being received is fading in (i.e., the signal is increasing in intensity), and control passes to step 325. If, however, the criteria of step 316 are not met, then in step 318 if the extant COFDM signal state variable is set to "ON" and the COFDM signal intensity is less than a second threshold Th2, then in step 319 the COFDM signal state variable is set to "FADING," indicating that the COFDM signal being received is fading out (i.e., the signal is decreasing in intensity), and control passes to step 325. Should the criteria of step 318 not met, then in step 320 if the COFDM TRACKING flag is clear and the COFDM signal intensity is less than the threshold Th2, then the COFDM signal state variable is set to "OFF," indicating that the COFDM signal is not present, and control is passed to step 325. Should the criteria of step 320 not be met, then no change is made to the COFDM signal state variable (i.e., it retains its previous value) and control passes to step 325. It is noted that for flows 311 and 312, steps 323 and 333 are similar to step 313 but obtain status data from demodulators 130, 140, respectively, and execute steps similar to steps 313-321 for the TDM1 and TDM2 signals, respectively. Exemplary values for Th1 and Th2 are 3 dB and 0 dB, respectively. Threshold values Th1, Th2 different from the values used for the COFDM process flow 310 may be used for the TDM process flows 311, 312. As noted above, in this embodiment, having a clear TRACKING flag does not mean the received signal is not present at the demodulator; the received signal intensity and the extant signal state variable value are used along with the TRACKING flag to determine whether a received signal is fading or not. It is understood that other techniques or process flows may be used to determine the state of a received signal.

Turning to FIG. 3B, at step 325 of portion 305, the AGC setpoint, ADC 113 resolution, and the power control settings are obtained based on the COFDM, TDM1, and TDM2 TRACKING flags, as described above in connection with Table 1 of FIG. 2. Next, in steps 340-342, it is determined if any of the COFDM, TDM1, and TDM2 signals (as determined in portion 303 of the flowchart 300) are fading, i.e., one or more of the signal state variables is set to "FADING." If so, then in step 345 the appropriate AGC step size group is the group in Table 2 of FIG. 2 identified as "FADING." If none of the received signals are fading, then in step 346 the appropriate AGC step size group is the group in Table 2 identified as "ON" or "OFF" (non-fading). It is understood that using two groups of step sizes is exemplary; any number of groups of AGC step sizes may be used as required.

Finally, in step 350 of flowchart portion 308, the new AGC setpoint, ADC 113 resolution, and power control settings are applied to the appropriate circuitry. Then, in step 355, the controller 150 executes the LMS algorithm (described above) to update the AGC control signal at node 117 (FIG. 1) using step sizes from the AGC step size group selected in steps 345 or 346, as appropriate, until the intensity value on node 116 is approximately equal to the AGC setpoint value obtained in step 325, ending step 355. Then the process begins again at steps 313, 323, and 333.

Advantageously, the controller 150, demodulators 120, 130, 140, detector 115, and memory 152 may be implemented in one or more programmable digital processors or fixed logic devices, such as microprocessors, digital signal processors (DSP), programmable logic devices (PLD), gate arrays, etc.

Although the present invention has been described in the context of an SDARS receiver, those skilled in the art will understand that the present invention can be implemented in the context of other types of multi-channel receivers, such as and without limitation, diversity receivers.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A method for processing one or more received signals of a plurality of possible received signals, the method comprising:
   (a) generating, based on a gain control signal, an output signal from the one or more received signals;
   (b) generating an intensity value in response to the output signal;
   (c) characterizing each of the possible received signals using a demodulator corresponding to the possible received signal;
   (d) selecting a setpoint value from a plurality of setpoint values in response to the characterizations of step (c), wherein each of the plurality of setpoint values corresponds to a different one of a plurality of possible combinations of the plurality of possible received signals, wherein the plurality of possible combinations includes at least one combination having two or more of the possible received signals; and
   (e) adaptively updating the gain control signal based on changes in the intensity value, wherein updates in the gain control signal result in the intensity value approximating the setpoint value.

2. The method of claim 1, wherein:
   the one or more received signals comprise at least two received signals; and
   step (a) comprises generating, based on the gain control signal, the output signal from the at least two signals.

3. The method of claim 1, wherein:
   step (c) comprises generating, for each possible received signal, a flag indicating whether the possible received signal is or is not present in a form sufficient for decoding; and
   step (d) comprises selecting the setpoint value from the plurality of setpoint values in response to the plurality of flags in combination.

4. The method of claim 3, wherein:
   the plurality of possible received signals comprise a possible COFDM signal and two possible TDM signals;
   the plurality of setpoint values are stored in a table having at least eight entries;
   step (c) comprises generating three flags corresponding to the possible COFDM signal and the two possible TDM signals, respectively; and step (d) comprises selecting the setpoint value by indexing the table with a pointer having a value formed from concatenating the three flags.

5. The method of claim 3, further comprising:
(f) generating, in response to the output signal, a signal strength signal for each possible received signal;
(g) processing the flag and the signal strength signal for each possible received signal to determine if the possible received signal is fading or not fading;
(h) selecting, based on whether at least one of the possible received signals is fading, a plurality of step sizes from a larger plurality of step sizes; and
(i) selecting a step size from the selected plurality of step sizes, wherein the gain control signal is updated based on the selected step size.

6. The method of claim 5, wherein the selected step size is proportional to a difference in magnitude between the setpoint value and the intensity value.

7. The method of claim 3, wherein each setpoint value of the plurality of setpoint values has at least one corresponding control signal value, and further comprising the step of generating at least one control signal in response to the at least one control signal value corresponding to the selected setpoint value.

8. The method of claim 7, wherein:
the method is implemented in a receiver; and
additional circuitry within the receiver is selectively enabled and disabled by the at least one control signal.

9. The method of claim 7, wherein the output signal is digitized by an analog-to-digital converter having a resolution controlled by the at least one control signal.

10. The method of claim 1, wherein the gain control signal is updated based on a selected step size proportional to a difference in magnitude between the setpoint value and the intensity value.

11. The method of claim 10, wherein the selected step size is chosen from a plurality of step sizes.

12. The method of claim 1, further comprising, for each characterization of step (c), the step of determining whether or not to decode the output signal using a decoder corresponding to the possible received signal.

13. A method for processing one or more received signals of a plurality of possible received signals, the method comprising:
(a) generating, based on a gain control signal, an output signal from the one or more received signals;
(b) generating an intensity value in response to the output signal;
(c) for each possible received signal, (i) determining whether or not to demodulate the output signal using a demodulator corresponding to the possible received signal and (ii) generating a flag in accordance with the determination;
(d) generating a signal strength signal for each possible received signal;
(e) selecting a plurality of step sizes from a larger plurality of step sizes in response to the plurality of flags and the plurality of signal strength signals;
(f) selecting a step size from the selected plurality of step sizes; and
(g) adaptively updating the gain control signal based on change in the intensity value and the selected step size.

14. The method of claim 13, wherein the one or more received signals comprise at least two received signals.

15. The method of claim 13, further comprising the step of processing the flag and the signal strength signal for each possible received signal to determine if the possible received signal is fading or not fading, wherein the plurality of step sizes is selected from the larger plurality of step sizes based on whether at least one of the possible received signals is fading.

16. The method of claim 15, wherein step (e) comprises selecting, as the selected plurality of step sizes, 1) a first plurality of step sizes from the larger plurality of step sizes if at least one of the possible received signals is fading and 2) a second plurality of step sizes from the larger plurality of step sizes if none of the possible received signals is fading.

17. The method of claim 13, further comprising the step of selecting a setpoint value from a plurality of setpoint values in response to the plurality of flags in combination, wherein the updating of the gain control signal results in the intensity value approximating the setpoint value.

18. The method of claim 17, wherein the selected step size is proportional to a difference in magnitude between the setpoint value and the intensity value.

19. The method of claim 17, wherein:
the plurality of possible received signals comprise a possible COFDM signal and two possible TDM signals;
the plurality of setpoint values are stored in a table having at least eight entries;
step (c) comprises generating three flags corresponding to the possible COFDM signal and the two possible TDM signals, respectively; and
the setpoint value is selected by indexing the table with a pointer having a value formed from concatenating the three flags.

20. The method of claim 13, further comprising, for each determination of step (c) to demodulate the output signal, the step of demodulating the output signal using the demodulator corresponding to the possible received signal.

21. A method for processing one or more received signals of a plurality of possible received signals, the method comprising:
(a) generating, based on a gain control signal, an output signal from the one or more received signals;
(b) generating an intensity value in response to the output signal;
(c) for each possible received signal, determining whether or not to demodulate the output signal using a demodulator corresponding to the possible received signal;
(d) generating a setpoint value in response to the determinations of step (c); and
(e) adaptively updating the gain control signal based on changes in the intensity value, wherein updates in the gain control signal result in the intensity value approximating the setpoint value, wherein:
step (c) further comprises generating, for each possible received signal, a flag indicating whether the possible received signal is or is not present in a form sufficient for demodulation; and
step (d) comprises selecting the setpoint value from a plurality of setpoint values in response to the plurality of flags in combination.

22. The method of claim 21, wherein:
the plurality of possible received signals comprise a possible COFDM signal and two possible TDM signals;
the plurality of setpoint values are stored in a table having at least eight entries;
step (c) comprises generating three flags corresponding to the possible COFDM signal and the two possible TDM signals, respectively; and
step (d) comprises selecting the setpoint value by indexing the table with a pointer having a value formed from concatenating the three flags.

23. The method of claim 21, further comprising:
(f) generating, in response to the output signal, a signal strength signal for each possible received signal;
(g) processing the flag and the signal strength signal for each possible received signal to determine if the possible received signal is fading or not fading;
(h) selecting, based on whether at least one of the possible received signals is fading, a plurality of step sizes from a larger plurality of step sizes; and
(i) selecting a step size from the selected plurality of step sizes, wherein the gain control signal is updated based on the selected step size.

24. The method of claim 23, wherein the selected step size is proportional to a difference in magnitude between the setpoint value and the intensity value.

25. The method of claim 21, wherein each setpoint value of the plurality of setpoint values has at least one corresponding control signal value, and further comprising the step of generating at least one control signal in response to the at least one control signal value corresponding to the selected setpoint value.

26. The method of claim 25, wherein additional circuitry within the receiver is selectively enabled and disabled by the at least one control signal.

27. The method of claim 25, wherein the output signal is digitized by an analog-to-digital converter having a resolution controlled by the at least one control signal.

* * * * *